United States Patent
Oliver et al.

(10) Patent No.: US 9,269,623 B2
(45) Date of Patent: Feb. 23, 2016

(54) EPHEMERAL BONDING

(71) Applicant: Rohm and Haas Electronic Materials LLC, Marlborough, MA (US)

(72) Inventors: Mark S. Oliver, Charlestown, MA (US); Michael K. Gallagher, Hopkinton, MA (US); Karen R. Brantl, West Springfield, MA (US)

(73) Assignee: Rohm and Haas Electronic Materials LLC, Marlborough, MA (US)

( * ) Notice: Subject to any disclaimer, the term of this patent is extended or adjusted under 35 U.S.C. 154(b) by 100 days.

(21) Appl. No.: 14/060,185

(22) Filed: Oct. 22, 2013

(65) Prior Publication Data

US 2014/0117504 A1    May 1, 2014

Related U.S. Application Data

(63) Continuation-in-part of application No. 13/661,025, filed on Oct. 25, 2012, now abandoned.

(51) Int. Cl.

| | |
|---|---|
| *H01L 21/00* | (2006.01) |
| *H01L 21/78* | (2006.01) |
| *C09J 5/00* | (2006.01) |
| *H01L 21/683* | (2006.01) |
| *H01L 29/06* | (2006.01) |

(52) U.S. Cl.
CPC . *H01L 21/78* (2013.01); *C09J 5/00* (2013.01); *H01L 21/6835* (2013.01); *H01L 29/06* (2013.01); *C09J 2203/326* (2013.01); *C09J 2205/302* (2013.01); *C09J 2423/00* (2013.01); *C09J 2471/00* (2013.01); *H01L 2221/6834* (2013.01); *H01L 2221/68318* (2013.01); *H01L 2221/68327* (2013.01); *H01L 2221/68381* (2013.01)

(58) Field of Classification Search
CPC .......................... H01L 21/78; H01L 21/6835
USPC .......................................................... 438/118
See application file for complete search history.

(56) References Cited

U.S. PATENT DOCUMENTS

| | | | |
|---|---|---|---|
| 4,661,193 | A | 4/1987 | Kirchhoff et al. |
| 6,559,215 | B2 | 5/2003 | Mills et al. |
| 7,482,249 | B2 | 1/2009 | Jakob et al. |

(Continued)

FOREIGN PATENT DOCUMENTS

| | | |
|---|---|---|
| JP | 2008-255270 | 10/2008 |
| JP | 2011-168663 | 9/2011 |

(Continued)

OTHER PUBLICATIONS

Chauffaille et al, "Pre-cracking behavior in the single cantilever beam adhesion test", Int J Fract, 2011, pp. 133-144, vol. 169.

(Continued)

*Primary Examiner* — Long K Tran
(74) *Attorney, Agent, or Firm* — S. Matthew Cairns

(57) ABSTRACT

Compositions containing an adhesive material and a release additive are suitable for temporarily bonding two surfaces, such as a wafer active side and a substrate. These compositions are useful in the manufacture of electronic devices where a component, such as an active wafer, is temporarily bonded to a substrate, followed by further processing of the active wafer.

10 Claims, 7 Drawing Sheets

(56) References Cited

U.S. PATENT DOCUMENTS

| | | | |
|---|---|---|---|
| 7,713,835 B2 | 5/2010 | Pillalamarri | |
| 7,759,050 B2 | 7/2010 | Kessel et al. | |
| 7,829,193 B2 | 11/2010 | Lorentz et al. | |
| 7,883,991 B1 | 2/2011 | Wu et al. | |
| 8,092,628 B2 | 1/2012 | Hong et al. | |
| 8,349,706 B2 | 1/2013 | Noda | |
| 9,034,139 B2 | 5/2015 | Koellnberger et al. | |
| 2003/0150557 A1* | 8/2003 | Sezi et al. | 156/330.9 |
| 2004/0121618 A1 | 6/2004 | Moore | |
| 2005/0221598 A1* | 10/2005 | Lu | H01L 21/6835 438/613 |
| 2006/0228552 A1* | 10/2006 | Schwantes et al. | 428/402.2 |
| 2008/0090380 A1 | 4/2008 | Gardner et al. | |
| 2008/0200011 A1* | 8/2008 | Pillalamarri et al. | 438/458 |
| 2009/0017323 A1 | 1/2009 | Webb et al. | |
| 2009/0176349 A1 | 7/2009 | Jakob et al. | |
| 2009/0218560 A1 | 9/2009 | Flaim et al. | |
| 2009/0233033 A1* | 9/2009 | Griswold | 428/41.8 |
| 2010/0038035 A1 | 2/2010 | Noda et al. | |
| 2010/0043608 A1 | 2/2010 | Jakob | |
| 2010/0263794 A1 | 10/2010 | George et al. | |
| 2011/0073901 A1 | 3/2011 | Fujita et al. | |
| 2011/0263095 A1 | 10/2011 | Takeuchi et al. | |
| 2011/0272092 A1 | 11/2011 | Richter | |
| 2011/0318938 A1 | 12/2011 | Takeuchi et al. | |
| 2012/0013013 A1 | 1/2012 | Sadaka et al. | |
| 2012/0028438 A1 | 2/2012 | Richter | |
| 2012/0034437 A1 | 2/2012 | Puligadda et al. | |
| 2012/0321819 A1 | 12/2012 | Kim et al. | |
| 2013/0192754 A1 | 8/2013 | Dukkipati et al. | |
| 2014/0150972 A1 | 6/2014 | Koellnberger et al. | |
| 2015/0034238 A1 | 2/2015 | Dronen et al. | |

FOREIGN PATENT DOCUMENTS

| | | |
|---|---|---|
| WO | 2006/093639 | 9/2006 |
| WO | 2009/003029 | 12/2008 |
| WO | 2011/100030 | 8/2011 |

OTHER PUBLICATIONS

Wimplinger et al, "Equipment and process solutions for low cost high volume manufacturing of 3D integrated devices," Pan Pacific Symposium Conference Proceedings, Feb. 14, 2012.

Chris Rosenthal, "Room temperature mechanical lift off debonding the next step in temporary wafer handling for 3D IC," Chip Scale Review, Jan./Feb. 2012, pp. 26-27.

Search report for corresponding European Application No. 13 19 0207.

* cited by examiner

EPHEMERAL BONDING

This application is a Continuation-in-Part of U.S. Non-Provisional patent application Ser. No. 13/661,025, filed on Oct. 25, 2012.

The present invention relates to the field of semiconductor manufacture, and more particularly to the temporary bonding of a semiconductor wafer to a substrate.

In many areas of manufacturing, parts to be worked on (processed) must be temporarily attached to another work piece or a support. For example, in the manufacture of semiconductor devices it is often necessary to support semiconductor wafers for various manufacturing steps. The requirement for thinner die packages has driven semiconductor manufacturers to thin semiconductor wafers. Such thinning is typically accomplished by temporarily adhering the front side of a semiconductor wafer, which contains active devices, to a carrier (support) in order to allow for grinding of the backside of the wafer. Also, thinned wafers may be subject to further manufacturing operations, such as metallization, cleaning, etching, and the like. After such processing, the thinned wafer must be detached (debonded) from the carrier. If the temporary adhesive bonds too strongly to the wafer, the wafer may suffer damage, such as breakage, or deformation of bonding features, during separation from the carrier. Alternatively, the temporary adhesive may lack sufficient bulk strength and remain on both the active surface (front side) of the wafer and on the substrate after separation requiring additional cleaning or etching steps.

Conventional temporary bonding adhesives used in the manufacture of semiconductor devices are either thermoplastic adhesives or crosslinking adhesives. Thermoplastic adhesives have the advantage that residual adhesive can be easily removed by solvent cleaning. A major problem with thermoplastic adhesives is that they become soft when heated which limits their use in certain applications. Crosslinking adhesives are not easily removed by solvent cleaning and are typically removed by peeling either during or after the debonding operation. This peeling step requires the crosslinking adhesives to have some degree of softness at room temperature. Unfortunately, this room temperature softness is problematic as it provides challenges in achieving uniform wafer thicknesses after a grinding operation.

In order to address these problems, multilayer approaches have been suggested where a release layer, such as a silicone material, is first applied to the active side of a wafer and then an adhesive is used to bond a substrate to the release layer-wafer. In such a system, a wider range of adhesives can be used because the ability to debond the wafer is provided by the release layer. For example, U.S. Pat. App. Pub. No. 2009/0176349 discloses applying a silicone oil to the wafer surface, and then depositing a graded plasmapolymeric layer followed by a substrate. The plasmapolymeric layer is deposited using a low-pressure plasma polymerization process where a graded composition of the polymeric layer is achieved by changing the reaction parameters, for example, the reaction gas composition. This process has certain drawbacks: it requires the application of a separate release layer on the wafer; it requires a low-pressure plasma polymerization apparatus; and the composition of the plasmapolymeric layer that is deposited on the wafer must be selected such that the plasmapolymeric layer has sufficient adhesiveness to the substrate, which may limit the plasma-polymerizable monomers that may be used.

Accordingly, there remains a need in the industry for temporary adhesives that are easy to apply, are easily removable, do not deform the active side of a wafer, and can be used in higher temperature operations than current temporary adhesives. The present invention addresses one or more of these deficiencies.

The present invention provides a method of releasably attaching a semiconductor wafer to a carrier substrate comprising: (a) providing a semiconductor wafer having a front side and a back side; (b) providing a carrier substrate having an attachment surface; (c) disposing a temporary bonding composition comprising a curable adhesive material and a release additive between the front side of the semiconductor wafer and the attachment surface of the carrier substrate; and (d) curing the adhesive material to provide a temporary bonding layer disposed between the front side of the semiconductor wafer and the attachment surface of the carrier substrate; wherein the temporary bonding layer adjacent to the attachment surface of the carrier substrate comprises a relatively lower amount of the release additive and the temporary bonding layer adjacent to the front side of the semiconductor wafer comprises a relatively higher amount of the release additive.

Also provided by the present invention is a structure comprising: a semiconductor wafer having a front side and a back side; a carrier substrate having an attachment surface; and a temporary bonding layer disposed between the front side of the semiconductor wafer and the attachment surface of the carrier substrate; wherein the temporary bonding layer comprises a cured adhesive material and a release additive; wherein the temporary bonding layer adjacent to the attachment surface of the carrier substrate comprises a relatively lower amount of the release additive and the temporary bonding layer adjacent to the front side of the semiconductor wafer comprises a relatively higher amount of the release additive.

Further, the present invention provides a composition comprising a curable adhesive material and a release additive. Preferably, the adhesive material is chosen from polyarylene oligomers, cyclic-olefin oligomers, arylcyclobutene oligomers, vinyl aromatic oligomers, and mixtures thereof. The release additive is non-curable under the conditions employed to cure the adhesive material.

It has been surprisingly found that the present invention addresses one or more of the deficiencies in conventional temporary bonding approaches used in the semiconductor industry. The present invention is effective in temporarily bonding a semiconductive wafer to a substrate (carrier) during certain processing steps. The wafer is then debonded from the substrate with significantly reduced, and preferably no, deformation of features, and significantly reduced, and preferably no, residual adhesive remaining on the active side of the wafer as compared to conventional temporary bonding adhesives. The present invention is particularly suitable for use in the processing of semiconductor wafers, or in any other application where a temporary bond is required.

Figure 1A:
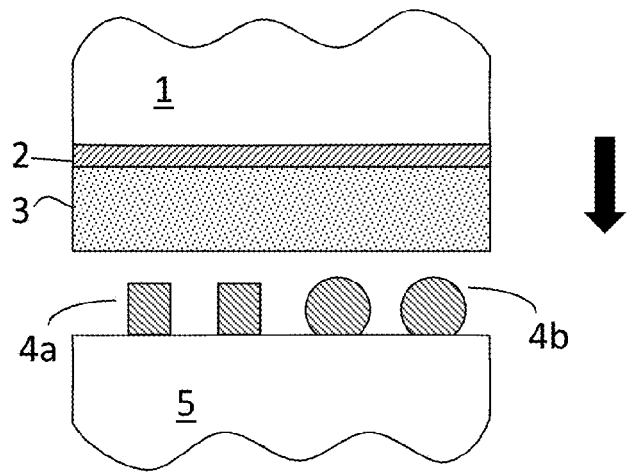
FIGS. 1A-1C are schematic diagrams illustrating alternate aspects of the process of the invention.

In the above figures, like numerals refer to like elements. It will be understood that when an element is referred to as being "adjacent to" another element, it can be directly adjacent to the other element or intervening elements may be present therebetween. In contrast, when an element is referred to as being "directly adjacent to" another element, there are no intervening elements present. As used herein, the term "and/or" includes any and all combinations of one or more of the associated listed items.

It will be understood that although the terms first, second, third, etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

As used throughout this specification, the following abbreviations shall have the following meanings, unless the context clearly indicates otherwise: ° C.=degrees Celsius; g=grams; mg=milligrams; L=liter; ppm=parts per million; μm=micron=micrometers; nm=nanometers; mm=millimeters; mL=milliliters; kPa=kilopascals; and GPa=gigapascals. All amounts are percent by weight and all ratios are molar ratios, unless otherwise noted. All numerical ranges are inclusive and combinable in any order, except where it is clear that such numerical ranges are constrained to add up to 100%. "Wt %" refers to percent by weight, based on the total weight of a referenced composition, unless otherwise noted.

As used throughout the specification, "feature" refers to the geometries on a substrate, and particularly on a semiconductive wafer. The term "alkyl" includes linear, branched and cyclic alkyl. Likewise, "alkenyl" refers to linear, branched and cyclic alkenyl. "Aryl" refers to aromatic carbocycles and aromatic heterocycles. "(Meth)acrylic" refers to both "acrylic" and "methacrylic". By the term "curing" is meant any process, such as polymerization or condensation, that increases the molecular weight of a material or composition. "Curable" refers to any material capable of being cured (polymerized) under certain conditions. The term "oligomer" refers to dimers, trimers, tetramers and other relatively low molecular weight materials that are capable of further curing. The articles "a", "an" and "the" refer to the singular and the plural.

It has been found that an adhesive composition comprising a curable adhesive material and a release additive may be used to form an ephemeral (or temporary) bonding layer. In use, the present adhesive composition is first disposed between a substrate (carrier) surface and a surface of a component, the composition is then cured, and various operations may then be performed on the component, after which the component is separated from the substrate.

In particular, the present invention provides a method of releasably attaching a semiconductor wafer to a carrier substrate comprising: (a) providing a semiconductor wafer having a front side and a back side; (b) providing a carrier substrate having an attachment surface; (c) disposing a temporary bonding composition comprising a curable adhesive material and a release additive between the front side of the semiconductor wafer and the attachment surface of the carrier substrate; and (d) curing the adhesive material to provide a temporary bonding layer disposed between the front side of the semiconductor wafer and the attachment surface of the carrier substrate; wherein the temporary bonding layer adjacent to the attachment surface of the carrier substrate comprises a relatively lower amount of the release additive and the temporary bonding layer adjacent to the front side of the semiconductor wafer comprises a relatively higher amount of the release additive.

A wide variety of semiconductor wafers may be employed in the present invention. As used herein, the term "semiconductor wafer" is intended to encompass "an electronic device substrate," "a semiconductor substrate," "a semiconductor device," and various packages for various levels of interconnection, including a single-chip wafer, multiple-chip wafer, packages for various levels, substrates for light emitting diodes (LEDs), or other assemblies requiring solder connections. Particularly suitable substrates are glass, sapphire, silicate materials, silicon nitride materials, silicon carbide materials, and patterned wafers, such as patterned silicon wafers and patterned gallium-arsenide wafers. Such wafers may be any suitable size. Preferred wafer diameters are 200 mm to 300 mm, although wafers having smaller and larger diameters may be suitably employed according to the present invention. As used herein, the term "semiconductive substrates" includes any substrate having one or more semiconductor layers or structures which include active or operable portions of semiconductor devices. The term "semiconductor substrate" is defined to mean any construction comprising semiconductive material, including but not limited to bulk semiconductive material such as a semiconductive wafer, either alone or in assemblies comprising other materials thereon, and semiconductive material layers, either alone or in assemblies comprising other materials. A semiconductor device refers to a semiconductor substrate upon which at least one microelectronic device has been or is being fabricated.

The front (or device) side of a semiconductor wafer typically contains active devices. An "active" device is any type of circuit component with the ability to electrically control electron flow, such as, for example, transistors. Typically, the front side of a semiconductor wafer also includes various features, such as metal bond pads, solder bumps (or solder balls), metal pillars, and the like. Metal bond pads typically comprise one or more metals chosen from copper, tin, gold, and silver. Exemplary solder bumps typically comprise one or more of tin, copper, silver, gold, lead, and bismuth, preferably tin, copper, silver, gold, and lead, and more preferably tin, copper, silver, gold, tin-lead, tin-silver, and tin-silver-copper. Metal pillars typically comprise copper, often capped with one or more other metals, such as silver or tin-silver. Preferably, the active surface of the semiconductor wafer is relatively hydrophilic as compared to the attachment surface of the carrier substrate. The hydrophilicity of the active surface may be increased by liquid or plasma treatment of the wafer surface to remove surface impurities such as adventitious carbon.

Any suitable carrier may be used as the carrier substrate. Exemplary carrier substrates include, without limitation, wafers, glass such as borosilicate, quartz, silica, and thermally stable polymers. Wafers used as carriers may be composed of silicon, silicon carbide, silicon germanium, silicon nitride, gallium arsenide, sapphire, and the like. Thermally stable polymers include, without limitation, any polymer stable to the temperatures used to cure the adhesive material, such as polyimide (for example, KAPTON™ polyimide, available from DuPont, Wilmington, Del.). Preferably, the attachment surface of the carrier substrate is relatively hydrophobic as compared to the active surface of the semiconductor wafer. If the attachment surface of the carrier substrate is insufficiently hydrophobic, the desired hydrophobicity may be imparted by any number of ways known in the art such as by contacting the attachment surface with a suitable adhesion promoter or by vapor treating the attachment surface. The attachment surface may be contacted with an adhesion promoter using any suitable method, such as spin-coating, dip coating, spray coating, curtain coating, roll coating, vapor deposition, and the like, and preferably by spin-coating. Various vapor treatments may be used to increase the hydrophobicity of the attachment surface, such as plasma treatments. Preferably, an adhesion promoter is used to treat the attachment surface to impart the desired hydrophobicity. Any suitable adhesion promoter may be used and the selection of such adhesion promoter is well within the ability of those skilled in the art. Preferred adhesion promoters are silane-containing materials, and more preferably trialkoxysilane-containing materials. Exemplary adhesion promoters include, but are not limited to: bis(trialkoxysilylalkyl)benzenes such as bis(trimethoxysilylethyl)benzene; aminoalkyl trialkoxy silanes such as aminopropyl trimethoxy silane, aminopropyl triethoxy silane, and phenyl aminopropyl triethoxy silane; and other silane coupling agents, as well as mixtures of the foregoing. Particularly suitable adhesion promoters include AP 3000, AP 8000, and AP 9000S, available from Dow Electronic Materials (Marlborough, Mass.).

The present temporary bonding compositions comprise a curable adhesive material and a release additive, and optionally an organic solvent. Typically, the curable adhesive material has a modulus of >1 GPa when cured. Exemplary curable adhesive materials include, without limitation, polyarylene oligomers, cyclic-olefin oligomers, arylcyclobutene oligomers, vinyl aromatic oligomers, and mixtures thereof. The curable adhesive material may be substituted with any suitable moiety to provide additional hydrophobicity, such as fluorine-containing groups, as long as such moieties do not adversely impact the mechanical properties of the cured adhesive material. Preferably, the curable adhesive material is chosen from polyarylene oligomers, cyclic-olefin oligomers, arylcyclobutene oligomers, vinyl aromatic oligomers, and mixtures thereof, and more preferably is chosen from one or more arylcyclobutene oligomers, vinyl aromatic oligomers or mixtures thereof. When a mixture of different curable adhesive materials is used in the present invention, such materials are selected such that they cure with each other during the curing step. When a mixture of different curable materials are used, such curable materials are used in a weight ratio of 99:1 to 1:99, preferably from 95:5 to 5:95, more preferably from 90:10 to 10:90, and still more preferably from 75:25 to 25:75.

A wide variety of polyarylene oligomers may be used in the present invention. As used herein, the term "polyarylenes" includes polyarylene ethers. Suitable polyarylene oligomers may be synthesized from precursors such as ethynyl aromatic compounds of the formula:

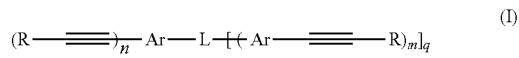
(I)

wherein each Ar is an aromatic group or inertly-substituted aromatic group: each R is independently hydrogen, an alkyl, aryl or inertly-substituted alkyl or aryl group; L is a covalent bond or a group which links one Ar to at least one other Ar; n and m are integers of at least 2; and q is an integer of at least 1. As such, the ethynyl aromatic compounds typically have four or more ethynyl groups (for example, tetraethynyl aromatic compounds).

Suitable polyarylene oligomers used in the temporary bonding compositions may comprise a polymer comprising as polymerized units:

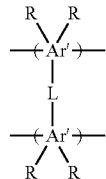
(II)

wherein Ar' is the residual of the reaction of product of (C≡C)$_n$—Ar or Ar—(C≡C)$_m$ moieties and R, L, n and m are as defined above. Polyarylene copolymers useful in the invention include as polymerized units a monomer having the formula:

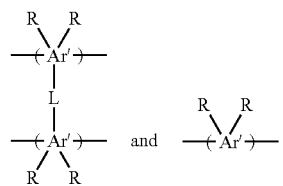
(III)

wherein Ar' and R are as defined above.

Exemplary polyarylenes include, but are not limited to, those wherein Ar-L-Ar is: biphenyl; 2,2-diphenyl propane; 9,9'-diphenyl fluorene; 2,2-diphenyl hexafluoro propane; diphenyl sulfide; oxydiphenylene; diphenyl ether; bis(phenylene)diphenylsilane; bis(phenylene)phosphine oxide; bis(phenylene)benzene; bis(phenylene)naphthalene; bis(phenylene)anthracene; thiodiphenylene; 1,1,1-triphenyleneethane; 1,3,5-triphenylenebenzene; 1,3,5-(2-phenylene-2-propyl)benzene; 1,1,1-triphenylenemethane; 1,1,2,2-tetraphenylene-1,2-diphenylethane; bis(1,1-diphenyleneethyl)benzene; 2,2'-diphenylene-1,1,1,3,3,3-hexafluoropropane; 1,1-diphenylene-1-phenylethane; naphthalene; anthracene; or bis(phenylene)napthacene; more preferably biphenylene; naphthylene; p,p'-(2,2-diphenylene propane) (or —C$_6$H$_4$—C(CH$_3$)$_2$—C$_6$H$_4$—); p,p'-(2,2-diphenylene-1,1,1,3,3,3hexafluoropropene) and (—C$_6$H$_4$—C(CF$_3$)$_2$—C$_6$H$_4$—). Useful bis-phenyl derivatives include 2,2-diphenyl propane; 9,9'-diphenyl fluorene; 2,2-diphenyl hexafluoro propane; diphenyl sulfide; diphenyl ether; bis(phenylene)diphenylsilane; bis(phenylene)phosphine oxide; bis(phenylene)benzene; bis(phenylene)naphthalene; bis(phenylene)anthracene; or bis(phenylene)napthacene.

The polyarylene precursor monomers may be prepared by a variety of methods known in the art, such as by: (a) selectively halogenating, preferably brominating, a polyphenol (preferably a bisphenol) preferably in a solvent, where each phenolic ring is halogenated with one halogen on one of the two positions ortho to the phenolic hydroxyl group; (b) converting the phenolic hydroxyl on the resulting poly(ortho-halophenol), preferably in a solvent, to a leaving group such as a sulfonate ester (for example, a trifluoromethanesulfonate ester prepared from trifluoromethanesulfonyl halide or trifluoromethane sulfonic acid anhydride) which is reactive with and replaced by terminal ethynyl compounds; and (c) reacting the reaction product of step (b) with an ethynyl-containing compound or an ethynyl synthon in the presence of an aryl ethynylation, preferably palladium, catalyst and an acid acceptor to simultaneously replace the halogen and the trifluoromethylsulfonate with an ethynyl-containing group (for example, acetylene, phenylacetylene, substituted phenylacetylene or substituted acetylene). Further explanation of this synthesis is provided in Int. Pat. App. No. WO 97/10193 (Babb).

The ethynyl aromatic monomers of Formula (I) are useful to prepare polymers of either Formula (II) or (III). Polymerization of the ethynyl aromatic monomers is well within the ability of one skilled in the art. While the specific conditions of polymerization are dependent on a variety of factors including the specific ethynyl aromatic monomer(s) being polymerized and the desired properties of the resulting polymer, the general conditions of polymerization are detailed in Int. Pat. App. No. WO 97/10193 (Babb).

Particularly suitable polyarylenes for use in the present invention include those sold as SiLK™ Semiconductor Dielectric (available from Dow Electronic Materials, Marlborough, Mass.). Other particularly suitable polyarylenes include those disclosed in WO 00/31183, WO 98/11149, WO 97/10193, WO 91/09081, EP 755 957, and U.S. Pat. Nos. 5,115,082; 5,155,175; 5,179,188; 5,874,516; and 6,093,636.

Suitable cyclic-olefin materials are poly(cyclic-olefins), which may be thermoplastic, and preferably have a weight average molecular weight ($M_w$) of from 2000 to 200,000 Daltons, more preferably from 5000 to 100,000 Daltons, and even more preferably from 2000 to 50,000 Daltons. Preferred poly(cyclic-olefins) have a softening temperature (melt viscosity at 3,000 PaS) of at least 100° C., and more preferably at least 140° C. Suitable poly(cyclic-olefins) also preferably have a glass transition temperature ($T_g$) of at least 60° C., more preferably from 60 to 200° C., and most preferably from 75 to 160° C.

Preferred poly(cyclic-olefins) are comprised of recurring monomers of cyclic-olefins and acyclic olefins, or ring-opening polymers based on cyclic-olefins. Suitable cyclic olefins for use in the present invention are chosen from norbornene-based olefins, tetracyclododecene-based olefins, dicyclopentadiene-based olefins, Diels-Alder polymers such as those derived from furans and maleimides, and derivatives thereof. Derivatives include alkyl (preferably $C_1$-$C_{20}$ alkyls, more preferably $C_1$-$C_{10}$ alkyls), alkylidene (preferably $C_1$-$C_{20}$ alkylidenes, more preferably $C_1$-$C_{10}$ alkylidenes), aralkyl (preferably $C_6$-$C_{30}$ aralkyls, more preferably $C_6$-$C_{18}$ aralkyls), cycloalkyl (preferably $C_3$-$C_{30}$ cycloalkyls, more preferably $C_3$-$C_{18}$ cycloalkyls), ether, acetyl, aromatic, ester, hydroxy, alkoxy, cyano, amide, imide, and silyl-substituted derivatives. Particularly preferred cyclic-olefins for use in the present invention include those chosen from

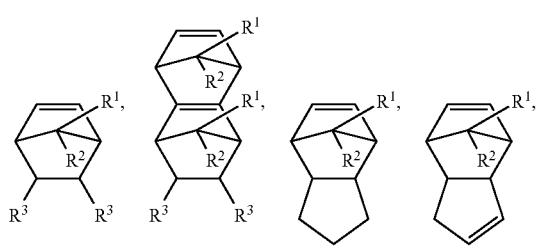

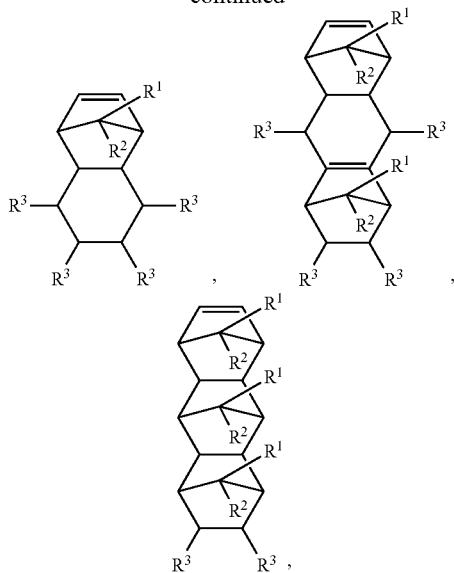

and combinations of the foregoing, where each $R^1$ and $R^2$ is independently chosen from H, and alkyl groups (preferably $C_1$-$C_{20}$ alkyls, more preferably $C_1$-$C_{10}$ alkyls), and each $R^3$ is independently chosen from H, substituted and unsubstituted aryl groups (preferably $C_6$-$C_{18}$ aryls), alkyl groups (preferably $C_1$-$C_{20}$ alkyls, more preferably $C_1$-$C_{10}$ alkyls), cycloalkyl groups (preferably $C_3$-$C_{30}$ cycloalkyl groups, more preferably $C_3$-$C_{18}$ cycloalkyl groups), aralkyl groups (preferably $C_6$-$C_{30}$ aralkyls, more preferably $C_6$-$C_{18}$ aralkyl groups such as benzyl, phenethyl, phenylpropyl, and the like), ester groups, ether groups, acetyl groups, alcohols (preferably $C_1$-$C_{10}$ alcohols), aldehyde groups, ketones, nitriles, and combinations thereof.

Preferred acyclic olefins are chosen from branched and unbranched $C_2$-$C_{20}$ alkenes (preferably $C_2$-$C_{10}$ alkenes). More preferably, the acyclic olefins have the structure $(R^4)_2C=C(R^4)_2$, where each $R^4$ is independently chosen from H and alkyl groups (preferably $C_1$-$C_{20}$ alkyls, more preferably $C_1$-$C_{10}$ alkyls). Particularly preferred acyclic olefins for use in the present invention include those chosen from ethene, propene, and butene, with ethene being the most preferred.

Methods of producing cyclic-olefin copolymers are known in the art. For example, cyclic-olefin copolymers can be produced by chain polymerization of a cyclic monomer with an acyclic monomer. When norbornene is reacted with ethene under such conditions, an ethene-norbornene copolymer containing alternating norbornanediyl and ethylene units is obtained. Examples of copolymers produced by this method include those available under the TOPAS™ (produced by Topas Advanced Polymers) and APEL™ (produced by Mitsui Chemicals) brands. A suitable method for making these copolymers is disclosed in U.S. Pat. No. 6,008,298. Cycloolefin copolymers can also be produced by ring-opening metathesis polymerization of various cyclic monomers followed by hydrogenation. The polymers resulting from this type of polymerization can be thought of conceptually as a copolymer of ethene and a cyclic-olefin monomer (such as alternating units of ethylene and cyclopentane-1,3-diyl). Examples of copolymers produced by this ring-opening method include those provided under the ZEONOR™ (from Zeon Chemicals) and ARTON™ (from JSR Corporation) brands. A suitable method of making these copolymers by this ring-opening method is disclosed in U.S. Pat. No. 5,191,026.

Arylcyclobutene oligomers useful as the present curable adhesive materials are well-known in the art. Suitable arylcyclobutene oligomers include, but are not limited to, those having the formula:

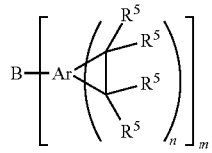

wherein B is an n-valent linking group; Ar is a polyvalent aryl group and the carbon atoms of the cyclobutene ring are bonded to adjacent carbon atoms on the same aromatic ring of Ar; m is an integer of 1 or more; n is an integer of 1 or more; and $R^5$ is a monovalent group. Preferably, the polyvalent aryl group, Ar, may be composed of 1-3 aromatic carbocyclic or heteroaromatic rings. It is preferred that the aryl group comprise a single aromatic ring, and more preferably a phenyl ring. The aryl group is optionally substituted with 1 to 3 groups chosen from $(C_1-C_6)$alkyl, tri$(C_1-C_6)$alkylsilyl, $(C_1-C_6)$alkoxy, and halo, preferably with one or more of $(C_1-C_6)$alkyl, tri$(C_1-C_3)$alkylsilyl, $(C_1-C_3)$alkoxy, and chloro, and more preferably with one or more of $(C_1-C_3)$alkyl, tri$(C_1-C_3)$alkylsilyl, and $(C_1-C_3)$alkoxy. It is preferred that the aryl group is unsubstituted. It is preferred that n=1 or 2, and more preferably n=1. It is preferred that m=1-4, more preferably m=2-4, and yet more preferably m=2. Preferably, $R^5$ is chosen from H and $(C_1-C_6)$alkyl, and more preferably from H and $(C_1-C_3)$alkyl. Preferably, B comprises one or more carbon-carbon double bonds (ethylenic unsaturation). Suitable single valent B groups preferably have the formula —[C($R^{10}$)=C$R^{11}$]$_x$Z, wherein $R^{10}$ and $R^{11}$ are independently chosen from hydrogen, $(C_1-C_6)$alkyl, and aryl; Z is chosen from hydrogen, $(C_1-C_6)$alkyl, aryl, siloxanyl, —CO$_2$$R^{12}$; each $R^{12}$ is independently chosen from H, $(C_1-C_6)$alkyl, aryl, aralkyl, and alkaryl; and x=1 or 2. Preferably, $R^{10}$ and $R^{11}$ are independently chosen from H, $(C_1-C_3)$alkyl, and aryl, and more preferably H and $(C_1-C_3)$alkyl. It is preferred that $R^{12}$ is $(C_1-C_3)$alkyl, aryl, and aralkyl. Z is preferably siloxyl. Preferred siloxyl groups have the formula —[Si($R^{13}$)$_2$—O]p-Si($R^{13}$)$_2$—, wherein each $R^{13}$ is independently chosen from H, $(C_1-C_6)$alkyl, aryl, aralkyl, and alkaryl; and p is an integer from 1 or more. It is preferred that $R^{13}$ is chosen from $(C_1-C_3)$alkyl, aryl, and aralkyl. Suitable aralkyl groups include benzyl, phenethyl and phenylpropyl.

Preferably, the arylcyclobutene oligomers comprise one or more oligomers of the formula:

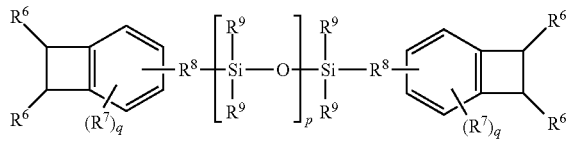

wherein each $R^6$ is independently chosen from H and $(C_1-C_6)$alkyl, and preferably from H and $(C_1-C_3)$alkyl; each $R^7$ is independently chosen from $(C_1-C_6)$alkyl, tri$(C_1-C_6)$alkylsilyl, $(C_1-C_6)$alkoxy, and halo; each $R^8$ is independently a divalent, ethylenically unsaturated organic group; each $R^9$ is independently chosen from H, $(C_1-C_6)$alkyl, aralkyl and phenyl; p is an integer from 1 or more; and q is an integer from 0-3. Each $R^6$ is preferably independently chosen from H and $(C_1-C_3)$alkyl, and more preferably each $R^6$ is H. It is preferred that each $R^7$ is independently chosen from $(C_1-C_6)$alkyl, tri$(C_1-C_3)$alkylsilyl, $(C_1-C_3)$alkoxy, and chloro, and more preferably from $(C_1-C_3)$alkyl, tri$(C_1-C_3)$alkylsilyl, and $(C_1-C_3)$alkoxy. Preferably, each $R^8$ is independently chosen from a $(C_2-C_6)$alkenyl, and more preferably each $R^8$ is —CH=CH—. Each $R^9$ is preferably chosen from $(C_1-C_3)$alkyl, and more preferably each $R^9$ is methyl. Preferably, p=1-5, more preferably p=1-3, and yet more preferably p=1. It is preferred that q=0. A particularly preferred arylcyclobutene oligomer, 1,3-bis(2-bicyclo[4.2.0]octa-1,3,5-trien-3-yl ethenyl)-1,1,3,3 tetramethyldisiloxane ("DVS-bis-BCB"), has the formula

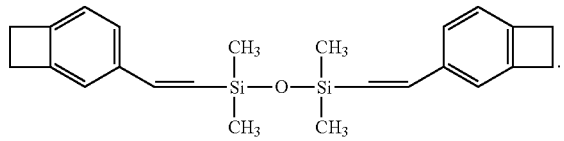

Arylcyclobutene oligomers may be prepared by any suitable means, such as those described in U.S. Pat. Nos. 4,812,588; 5,136,069; 5,138,081; and International Pat. App. No. WO 94/25903. Suitable arylcyclobutene oligomers are also commercially available under the CYCLOTENE™ brand, available from Dow Electronic Materials. The arylcyclobutene oligomers may be used as is, or may be further purified by any suitable means.

Any vinyl aromatic oligomers capable of being cured may be used as the curable adhesive materials in the present. Such vinyl aromatic oligomers are typically oligomers of a vinyl aromatic monomer with one or more reactive ethylenically unsaturated co-monomers. Preferably, the vinyl aromatic monomers contain one vinyl group. Suitable vinyl aromatic monomers are unsubstituted vinyl aromatic monomers and substituted vinyl aromatic monomers where one or more hydrogens are replaced with a substituent group selected from the group of $(C_1-C_6)$alkyl, $(C_1-C_6)$alkoxy, halo, and amino. Exemplary vinyl aromatic monomers include, without limitation, styrene, vinyltoluene, vinylxylene, vinylanisole, vinyldimethoxybenzene, vinylaniline, halostyrene such as fluorostyrene, α-methylstyrene, β-methoxystyrene, ethylvinylbenzene, vinylpyridines, vinylimidazoles, vinylpyrroles, and mixtures thereof. Preferred vinyl aromatic monomers are styrene, vinyltoluene, vinylxylene, vinylanisole, ethylvinylbenzene, and mixtures thereof. Preferred reactive co-monomers are those comprising a reactive moiety, that is, a moiety capable of further polymerization (or crosslinking) following formation of the vinyl aromatic oligomer, such as an allyl moiety or a vinyl group, in addition to an olefinic (or ethylenically unsaturated) moiety used to for the vinyl aromatic oligomer. Such reactive co-monomers may suitably be any asymmetrical diene or triene capable of further polymerization by Diels-Alder reaction subsequent to being oligomerized with the vinyl aromatic monomer. More preferably, the reactive co-monomers comprise an allyl moiety in addition to the ethylenic unsaturation used to form the vinyl aromatic oligomer, and even more preferably comprise an allyl ester moiety in addition to the ethylenic unsaturation. Exemplary reactive co-monomers useful in forming the vinyl aromatic oligomers include, but are not limited to, vinylcyclohexene, vinyl ethers, asymmetrical dienes or trienes such as terpene monomers, dicyclopentadiene, diallyl maleate, allyl acrylate, allyl methacrylate, allyl cinnamate, diallyl fumarate, allyl tiglate, divinylbenzene, and mixtures thereof.

Preferred reactive co-monomers are diallyl maleate, allyl acrylate, allyl methacrylate, allyl cinnamate, diallyl fumarate, and mixtures thereof, and more preferably diallyl maleate, allyl methacrylate and mixtures thereof. Exemplary terpene monomers include, without limitation, limonene, dipentene, myrcene, and the like. It will be appreciated by those skilled in the art that one or more secondary co-monomers may also be used to form the vinyl aromatic oligomers. Such secondary co-monomers are ethylenically unsaturated, but do not contain a reactive moiety. Exemplary secondary co-monomers include, but are not limited to, (meth)acrylic acid, (meth) acrylamides, ($C_1$-$C_{10}$)alkyl(meth)acrylates, aromatic (meth) acrylates, substituted ethylene monomers, and poly(alkylene oxide) monomers.

The molar ratio of vinyl aromatic monomers to co-monomers in such vinyl aromatic oligomers is preferably from 99:1 to 1:99, more preferably from 95:5 to 5:95, and still more preferably from 90:10 to 10:90. Such vinyl aromatic oligomers may be prepared by any suitable method, such as any of those known in the art. Typically, vinyl aromatic oligomers are prepared by free-radical polymerization of a vinyl aromatic monomer and a co-monomer. Preferred vinyl aromatic oligomers comprise unreacted allyl moieties that allow such oligomers to further cure.

A wide variety of materials may be used as the release additives in the temporary bonding compositions provided that such materials do not react with the adhesive material under conditions of storage and use, and are non-curable under the conditions used to cure the adhesive material. In addition, the release additives should be compatible with the temporary bonding composition, that is, the release additives must be dispersible, miscible or otherwise substantially compatible with the adhesive material, and any other components, such as organic solvents, used in the temporary bonding composition. When an organic solvent (or mixed solvent system) is used in the temporary bonding composition, both the release additive and the curable adhesive material must be soluble in such solvent. The present release additives are sufficiently non-volatile such that they do not substantially evaporate under the conditions of use, that is, they substantially do not evaporate during any deposition step, such as spin-coating, or any subsequent heating step used to remove any organic solvent or to cure the adhesive material. When a film or layer of the temporary bonding composition is cast, such as by spin-coating, much (or all) of the solvent evaporates. It is preferred that the release additive is soluble in any organic solvent used, but is not completely soluble in the curable adhesive material. The release additives are preferentially more hydrophilic than the cured adhesive material. Not being bound by theory, it is believed that upon curing of the adhesive material, the release additive phase separates and migrates preferentially toward the active surface of the wafer (the more hydrophilic surface as compared to the carrier surface). The use of appropriate hydrophilic moieties in the release additives allow for complete dispersion, or preferably dissolution, of the release additive in the temporary bonding composition, and phase separation of the release additive during curing of the adhesive material with migration of the release additive toward the more hydrophilic surface. Any material which does not phase separate from the adhesive material during curing will not function as a release additive according to the present invention.

In general, the release additives will contain one or more relatively hydrophilic moieties, such as moieties containing one or more of oxygen, nitrogen, phosphorus, and sulfur. Suitable release additives include, without limitation: ethers, esters, carboxylates, alcohols, thioethers, thiols, amines, imines, amides, phosphate esters, sulfonate esters, and mixtures thereof. Preferably, the release additives contain one or more polar end groups, which contain one or more of oxygen, nitrogen and sulfur, and preferably oxygen. Exemplary polar end groups include: alkoxy, aryloxy, hydroxy, carboxylate, alkoxycarbonyl, mercapto, alkylthio, primary amine, secondary amine, and tertiary amine; preferably the end groups are chosen from ($C_1$-$C_6$)alkoxy, ($C_6$-$C_{10}$)aryloxy, hydroxy, carboxylate, ($C_1$-$C_6$)alkoxycarbonyl, mercapto, ($C_1$-$C_6$)alkylthio, amino, ($C_1$-$C_6$)alkylamino, and di($C_1$-$C_6$)alkylamino; more preferably from ($C_1$-$C_6$)alkoxy, ($C_6$-$C_{10}$)aryloxy, hydroxy, carboxylate, and ($C_1$-$C_6$)alkoxycarbonyl; and even more preferably from ($C_1$-$C_6$)alkoxy, hydroxy, carboxylate, and ($C_1$-$C_6$)alkoxycarbonyl. Particularly preferred polar end groups are chosen from hydroxy, methoxy, ethoxy, propoxy, butoxy, carboxyl, and acetoxy. Preferably, the release additives are free of silicon.

Suitable release additives have a number average molecular weight ($M_n$) of ≤10,000 Daltons, preferably ≤7500 Daltons, and more preferably ≤7000 Daltons. The release additives have a minimum molecular weight ($M_n$) sufficient to render the release additives substantially non-volatile during conditions of use, that is, <5%, preferably <3%, and more preferably ≤1% of the release additive is volatilized during use. Preferably, the release additives have a $M_n$ of ≥500 Daltons. A preferred range of $M_n$ is from 500 to 10,000 Daltons, more preferably from 500 to 7500 Daltons, and yet more preferably from 500 to 7000 Daltons. While the release additives may be linear polymers; branched polymers such as dendritic polymers, star polymers, and the like; polymer particles; and the like, it is preferred that the release additives are linear polymers or polymer particles, and more preferably linear polymers. While not being bound by theory, it is believed that linear polymers are better able to migrate through the curing adhesive material phase toward the hydrophilic wafer surface as compared to branched polymers.

Polyethers are the preferred release additives. Polyether compounds include alkyleneoxide homopolymers and alkyleneoxide copolymers, which copolymers may be random or block. Polyalkylene oxide release additives may have a variety of polar end groups, preferably such polar end groups are hydroxy, ($C_1$-$C_6$)alkoxy, and ($C_1$-$C_6$)alkoxycarbonyl, and more preferably hydroxy, ($C_1$-$C_3$)alkoxy, and acetoxy. Preferred polyether compounds are polyglycols (or polyalkylene oxides), such as poly($C_1$-$C_4$)alkylene oxide compounds, which may comprise a single alkylene oxide repeating unit, or two or more different alkylene oxide repeating units. Preferred polyether compounds include polyethylene glycol, polypropyleneglycol, poly(1,3-propanediol), poly(tetrahydrofuran), ethylene oxide-propylene oxide copolymers, ethylene oxide-butylene oxide copolymers, and mixtures thereof. Preferably, when the release additive comprises butylene oxide as a repeating unit, it is a copolymer with one or more different alkylene oxide repeating units. It will be appreciated by those skilled in the art that mixtures of release additives may be used in the present temporary bonding compositions. Suitable release additives include polyethers sold under the PLURONIC, TETRONIC and POLYTHF product names (available from BASF, Ludwigshafen, Germany), the FORTEGRA product name (available from The Dow Chemical Company, Midland Mich.), and the TERATHANE product name (available from Invista, Wichita, Kans.), all of which may be used without further purification.

It is preferred that one or more organic solvents be used in the temporary bonding composition. Any solvent or mixture of solvents that dissolves or disperses, and preferably dissolves, the curable adhesive material and release additive may suitably be used in the temporary bonding compositions. Exemplary organic solvents include, without limitation: aromatic hydrocarbons such as toluene, xylene, and mesitylene; alcohols such as 2-methyl-1-butanol, 4-methyl-2-pentanol, and methyl isobutyl carbinol; esters such as ethyl lactate, propylene glycol methyl ether acetate, and methyl 2-hydroxyisobutyrate; lactones such as gamma-butyrolactone; lactams such as N-methylpyrrolidinone; ethers such as propylene glycol methyl ether and dipropylene glycol dimethyl ether isomers (commercially available from The Dow Chemical Company as PROGLYDE™ DMM); ketones such as cyclohexanone and methylcyclohexanone; and mixtures thereof.

The present temporary bonding compositions may optionally include one or more additional components, such as curing agents, antioxidants, thickening agents, and the like. Suitable curing agents may aid in the curing of the adhesive material, and may be activated by heat or light. Exemplary curing agents include, but are not limited to, thermally generated initiators, photoinitiators, azides, nitrenes, and crosslinking agents such as polyamines and polythiols. Thickening agents include any materials that increase the viscosity of the temporary bonding composition, such as to reduce bleed out of the composition from between the carrier and active device before the adhesive material has fully cured. Thickening agents also include low molecular weight materials that may be quickly advanced (polymerized) in order to increase the viscosity of the temporary bonding composition in use. The selection of such additional components is well within the ability of those skilled in the art.

The temporary bonding composition comprises one or more curable adhesive materials in an amount of 50 to 99 wt %, one or more release additives in an amount of 1 to 50 wt %, optionally organic solvent, and optionally one or more additional components. The curable adhesive material is preferably present in an amount of 50 to 95 wt %. It is preferred that the release additive is present in an amount of 2 to 50, more preferably from 5 to 45, and even more preferably from 5 to 40 wt %. When present, the amount of organic solvent is preferably sufficient to dissolve or disperse, and preferably dissolve, the curable adhesive material and the release additive. The amount of organic solvent is typically from 0 to 50 wt %. Preferably, an organic solvent is used. The present temporary bonding compositions may be prepared by combining the curable adhesive material, the release additive, and any optional components in any order.

In use, the present temporary bonding compositions may be disposed by any suitable method on the attachment surface of the carrier substrate, the front side of the semiconductor wafer, or on both surfaces. Suitable methods for disposing the temporary bonding composition include, but are not limited to, spin-coating, curtain coating, spray coating, roller coating, dip coating, vapor deposition, and lamination such as vacuum lamination, among other methods. In the semiconductor manufacturing industry, spin-coating is a preferred method to take advantage of existing equipment and processes. In spin-coating, the solids content of the composition may be adjusted, along with the spin speed, to achieve a desired thickness of the composition on the surface it is applied to. Typically, the present compositions are spin-coated at a spin speed of 400 to 4000 rpm. The amount of the temporary bonding composition dispensed on the wafer or substrate depends on the total solids content in the composition, the desired thickness of the resulting temporary bonding layer, and other factors well-known to those skilled in the art. Preferably, after being disposed on a surface, the temporary bonding composition is heated (baked) to remove any solvent present. Typical baking temperatures are from 90 to 140° C., although other temperatures may be suitably used. Such baking to remove residual solvent is typically done for approximately 2 minutes, although longer or shorter times may suitably be used.

In an alternate preferred method, the temporary bonding composition is formed as a dry film and is disposed on the attachment surface of the carrier substrate, the front side of the semiconductor wafer, or on both surfaces by lamination. A variety of suitable lamination techniques, including vacuum lamination techniques, may be used and are well known to those skilled in the art. In forming a dry film, the temporary bonding composition is first disposed onto a front surface of a suitable film support sheet such as a polyester sheet, preferably polyethyleneterephthalate (PET) sheet, or a polyimide sheet such as KAPTON™ polyimide, using slot-die coating, gravure printing, or another appropriate method. The composition is then soft baked at a suitable temperature, such as from 90 to 140° C., for an appropriate time, such as from 1 to 30 minutes, to remove any solvent. A polymer film cover sheet such as polyethylene is then roll-laminated at room temperature onto the dried temporary bonding composition to protect the composition during storage and handling. To dispose the dried temporary bonding composition onto the carrier and/or the semiconductor wafer, the cover sheet is first removed. Then, the dried temporary bonding composition on the support sheet is laminated onto the appropriate surface using roll-lamination or vacuum lamination. The lamination temperature can range from 20 to 120° C. The support sheet is then removed (peeled), leaving the dried temporary bonding composition on that surface. Using this method, the structures illustrated in FIGS. 1A, 1B, and 1C can all be realized.

Figure 1B:
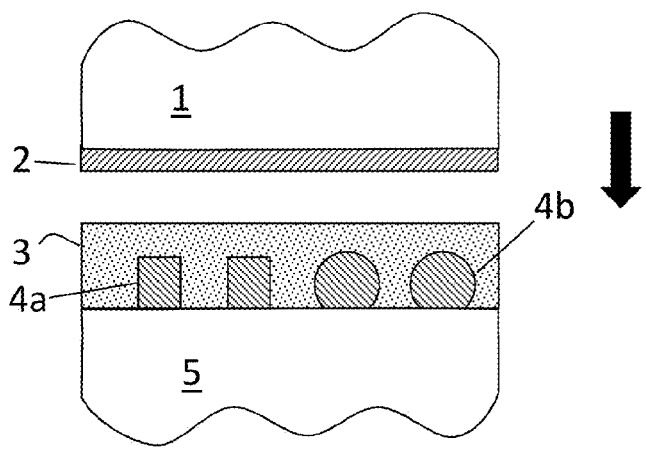
Figure 1C:
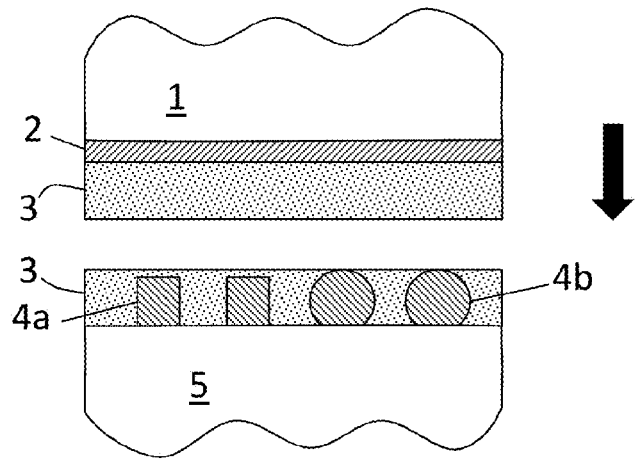

FIG. 1A illustrates a first embodiment of the invention where temporary bonding composition 3 is disposed, such as by spin-coating, on optional adhesion promoter layer 2 on the attachment surface of carrier substrate 1. FIG. 1B illustrates an alternate embodiment of the invention where temporary bonding composition 3 is disposed on the front surface of semiconductor wafer 5 having features such as metal pillars 4a and/or solder bumps 4b. It will be appreciated by those skilled in the art that a semiconductor wafer may have only metal pillars, or solder bumps, or a combination of metal pillars and solder bumps, or neither metal pillars nor solder bumps. Temporary bonding composition 3 in FIG. 1B is sufficiently flowable to fill-in around features 4a and 4b. In FIG. 1B, the attachment surface of carrier substrate 1 has optional adhesion promoter layer 2. FIG. 1C illustrates a third embodiment of the invention where temporary bonding composition 3 is disposed both on the front side of semiconductor wafer 5 and on the attachment surface of carrier substrate 1 having adhesion promoter layer 2. Temporary bonding composition 3 in FIG. 1C is sufficiently flowable to fill-in around features 4a and 4b. In FIG. 1C, the temporary bonding composition disposed on the semiconductor wafer may be the same as, or different from, the temporary bonding disposed on the attachment surface of the carrier substrate. It will be appreciated by those skilled in the art that multiple layers of the temporary bonding composition may be applied in order to achieve the desired thickness.

After the temporary bonding composition is disposed on the front side of the semiconductor wafer or the attachment surface of the carrier substrate, a structure is formed by bringing the attachment surface of the carrier wafer or the front surface of the semiconductor wafer, respectively, into contact with the temporary bonding composition, as illustrated by the arrows in FIGS. 1A and 1B. After the temporary bonding composition is disposed on both the front side of the semiconductor wafer and the attachment surface of the carrier substrate, a structure is formed by bringing the two temporary bonding composition layers into contact, as illustrated by the arrow in FIG. 1C. Any suitable method may be used to bring into contact the carrier substrate, semiconductor wafer and temporary bonding composition, such as by thermocompression bonding, where pressure and heat are applied. Exemplary methods are described in U.S. Pat. No. 7,713,835 and in U.S. Pat. App. Pub. Nos. 2010/0263794 and 2011/0272092. Typically, thermocompression bonding is carried out under vacuum in order to reduce voiding. It is preferred that both the carrier substrate and the semiconductor wafer are placed in a vacuum chamber, the temporary bonding composition disposed on at least one of the carrier substrate and the wafer is then heated to a desired temperature, such as 50 to 200° C. for 1 to 10 minutes in the case of an arylcyclobutene adhesive material, next the chamber is evacuated and the carrier substrate and the semiconductor wafer are contacted to the temporary bonding composition, and the chamber is then optionally pressurized, such as to 1 to 100 kPa. Next, the bonded pair may be removed from the chamber and cured, or optionally cured within the chamber. Curing of the temporary bonding composition is typically achieved by heating the composition to a temperature of 180 to 250° C. for 1 to 600 minutes in the case of an arylcyclobutene adhesive material.

Figure 2A:
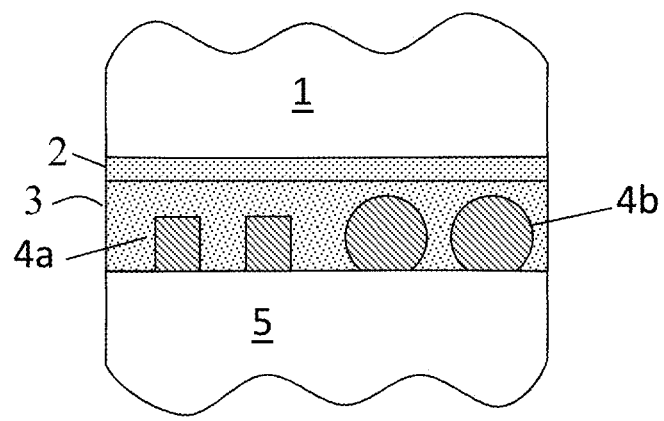
FIGS. 2A-2F are schematic diagrams illustrating the process of the invention.

FIG. 2A illustrates a structure formed after the components illustrated in each of FIGS. 1A-1C are brought into contact. In FIG. 2A, semiconductor wafer 5 has topographic features shown as metal pillars 4a and solder bumps 4b, temporary bonding composition 3 is directly adjacent semiconductor wafer 5 and is disposed around features 4a and 4b, temporary bonding composition is also directly adjacent to optional adhesion promoter layer 2 which is directly adjacent carrier substrate 1. Once the structure in FIG. 2A is formed, the temporary bonding composition is then subjected to conditions sufficient to cure the adhesive material. Such conditions include heating, exposure to actinic radiation (light) or a combination thereof. Preferably, heating is used, either alone or in combination with exposure to light, and more preferably the adhesive material is cured by heating. The rate of heating is chosen such that the adhesive material does not cure instantaneously, but cures in a more controlled manner. That is, the rate of polymerization must be less than the rate of phase separation.

Figure 2B:
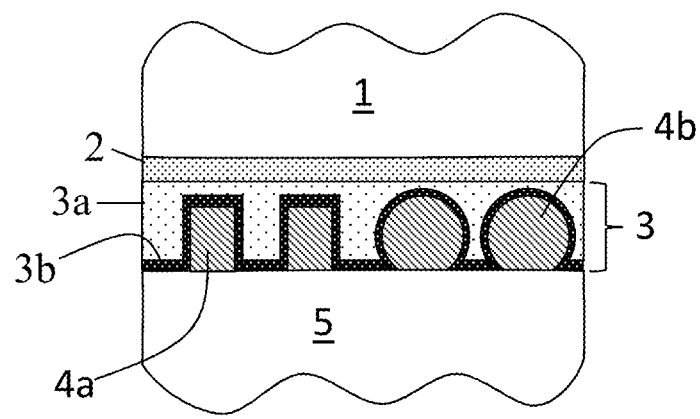

During curing, without being bound by theory, it is believed that the release additive phase separates from the curing adhesive material (that is, polymerization induced phase separation occurs) and generally migrates toward the relatively more hydrophilic surface (front side) of the semiconductor wafer. Following curing, a temporary bonding layer is formed between the semiconductor wafer and the attachment surface of the carrier substrate as illustrated in FIG. 2B, where the cured temporary bonding composition (now the temporary bonding layer) 3 is composed of a first region 3a adjacent to the carrier wafer comprising a relatively lower amount of release additive and a second region 3b adjacent to the semiconductor wafer and comprising a relatively higher (greater) amount of release additive. Region 3b is relatively smaller as compared to region 3a. FIG. 2B shows defined regions 3a and 3b only for purposes of illustration. It is believed, without being bound by theory, that regions 3a and 3b may represent a continuum of concentrations (from lower at 3a to higher at 3b) of the release additive in the temporary bonding layer or they may represent distinct regions comprising different concentrations of the release additive, where region 3b may comprise a predominant amount of release additive. Whether regions 3a and 3b represent distinct regions or a continuum, region 3b predominantly comprises the release additive. When the cured adhesive material (temporary bonding layer) is composed of an arylcyclobutene adhesive material, such cured material typically has a modulus of >1 GPa, and an elongation of <20% at the breaking point.

Figure 2C:
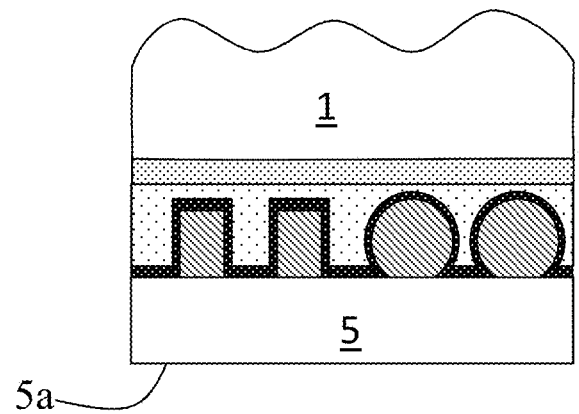
Figure 2D:
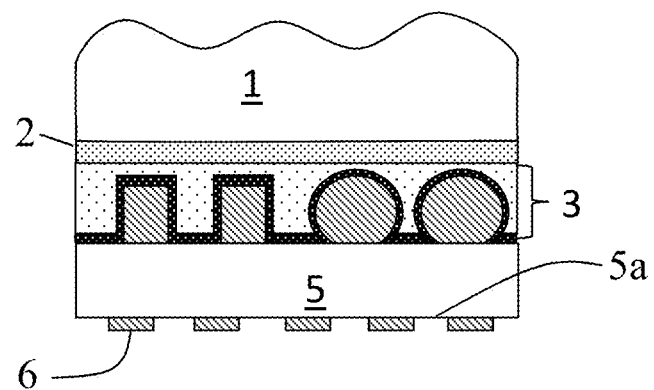

Once the temporary bonding layer is formed, one or more suitable operations may be performed on the semiconductor wafer, such as grinding (thinning) the backside of the wafer, as illustrated in FIG. 2C where the backside of semiconductor wafer 5 has been ground (thinned) and a flat surface 5a formed. Further operations may be performed, such as patterning, the formation of via holes, and the formation of conductive contacts on the backside of the semiconductor wafer. FIG. 2D illustrates a structure having carrier substrate 1 having an optional adhesion promoter layer 2, temporary bonding layer 3 joining semiconductor wafer 5 to carrier substrate 1, where the temporary bonding layer surrounds interconnect features, such as metal pillars and/or solder bumps on the front side of the semiconductor wafer, where the backside of wafer 5 has been ground and metal contacts 6 formed thereon.

The greater concentration of release additive adjacent, and preferably directly adjacent, to the front side of the semiconductor wafer relative to the concentration of the release additive in the temporary bonding layer adjacent to the carrier substrate provides a structure having a lower adhesion energy between the semiconductor wafer and the temporary bonding layer as compared to the adhesion energy between the carrier substrate and the temporary bonding layer. Preferably, the difference in adhesion energy between the semiconductor wafer-temporary bonding layer interface and the carrier substrate-temporary bonding layer interface is >20 J/m$^2$, and more preferably >25 J/m$^2$. The adhesion energy between the temporary bonding layer and the front side of a semiconductor wafer that does not have interconnect structures is ≤5 J/m$^2$, preferably <5 J/m$^2$, more preferably <3 J/m$^2$, and most preferably ≤2 J/m$^2$. The adhesion energy between the temporary bonding layer and the attachment surface of the carrier substrate is preferably >30 J/m$^2$, more preferably >35 J/m$^2$, and yet more preferably ≥40 J/m$^2$. Such differences in adhesion energy allows for easier release of the semiconductor wafer from the temporary bonding layer as compared to the carrier substrate.

Figure 2E:
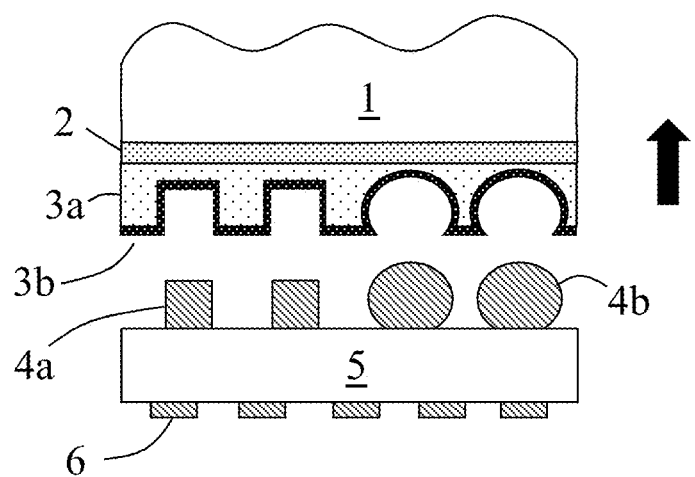
Figure 2F:
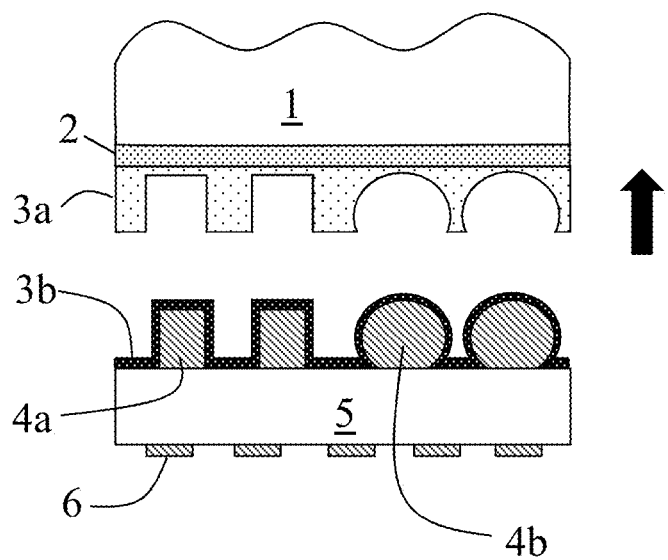

After completion of the operations to be performed on the semiconductor wafer, the wafer is then separated from the carrier substrate and the temporary bonding layer. Any suitable method for separating the semiconductor wafer from the temporary bonding layer may be used, such as those disclosed in U.S. Pat. App. Pub. Nos. 2010/0263794; 2011/0308739; and 2012/0028438, and Int. Pat. App. No. WO 2011/079170. The structure may optionally be heated in order to facilitate separation of the semiconductor wafer, but such heating is not required. An advantage of the present invention is that with such low adhesion energy between the temporary bonding layer and the semiconductor wafer, separation is easily achieved by forcing a wedge between the semiconductor wafer and the carrier substrate to force or pry apart the structure. Once separation initiates, the semiconductor wafer is easily separated from the temporary bonding layer. FIG. 2E illustrates one aspect of the invention showing processed semiconductor wafer 5 having topographic features shown as metal pillars 4a and solder bumps 4b on the front side and conductive contacts 6 on the back side separating from carrier substrate 1 having optional adhesion promoter layer 2, and both regions 3a and 3b of the temporary bonding layer. The processed semiconductor wafer 5 is then rinsed with an appropriate solvent or solvent mixture to remove any residue, and then dried. Suitable rinse agents include, without limitation, isopropanol, acetone, mesitylene, ammonia/water, water/surfactant, and the like. FIG. 2F illustrates an alternate aspect where region 3b remains on the front side of the semiconductive wafer following separation, which is then easily removed by contacting semiconductor wafer 5 with an appropriate solvent or solvent mixture followed by drying. As illustrated in FIGS. 2E and 2F, the present temporary bonding layer is able to be removed from the surface of a semiconductive wafer, even from areas having topographic features such as metal pillars and solder bumps, leaving little to no cured adhesive material residue.

Figure 3A:
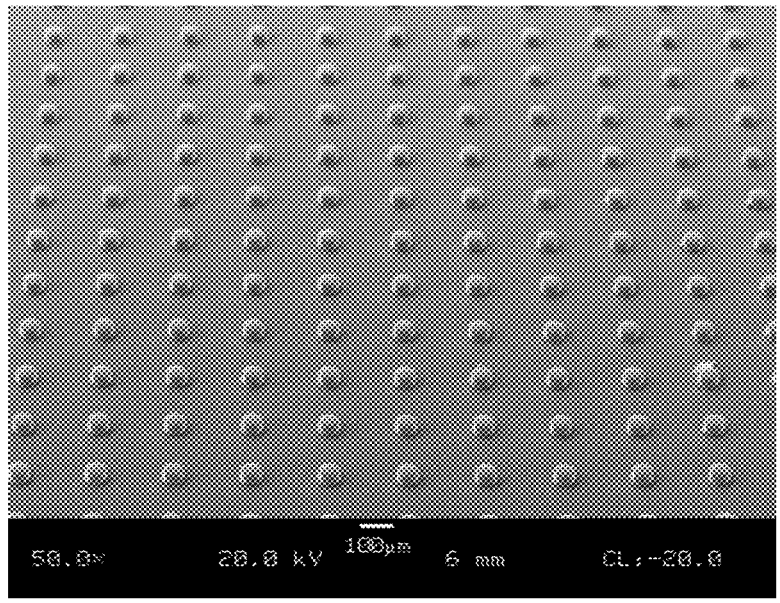
FIGS. 3A-3D are scanning electron micrographs showing the releasability of the adhesive of the invention from surfaces containing copper pillars.
Figure 3B:
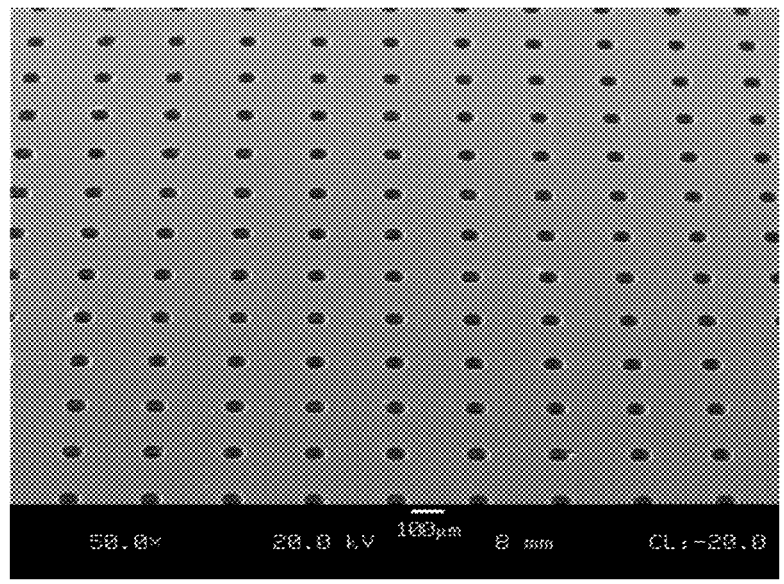
Figure 3C:
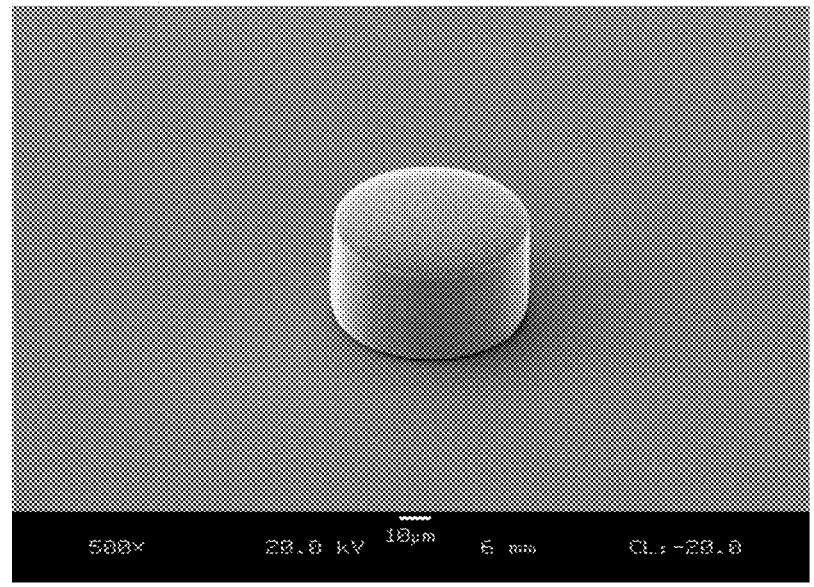
Figure 3D:
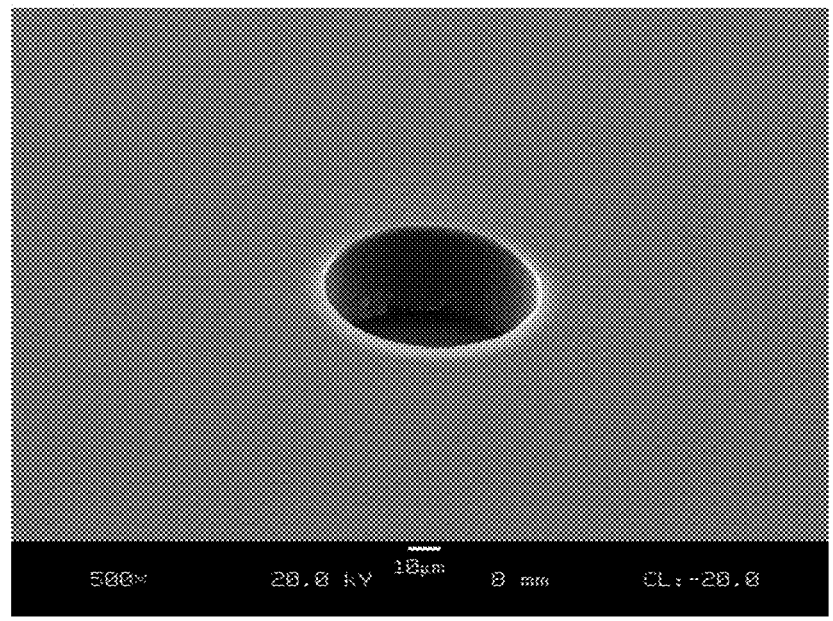

FIGS. 3A-3D are scanning electron micrographs showing the releasability of a semiconductor wafer having an array of copper pillars from the present temporary bonding layer comprising DVS-bisBCB as the curable adhesive material and a polyether release additive. FIG. 3A shows the array of copper pillars on the semiconductor wafer after separation from the present temporary bonding layer and solvent rinsing. FIG. 3B is shows the surface of the temporary bonding layer after separation from the semiconductor wafer. FIG. 3C is a close-up view of a single copper pillar from the array on the semiconductor wafer and FIG. 3D is a close-up of a single hole in the temporary bonding layer after separation of the semiconductor wafer. As can be seen from these micrographs, the semiconductor wafer separated completely from the temporary bonding layer, with no visible residue remaining on either the wafer surface or on the copper pillars after solvent rinsing, and with little to no damage to the semiconductor wafer.

Figure 4A:
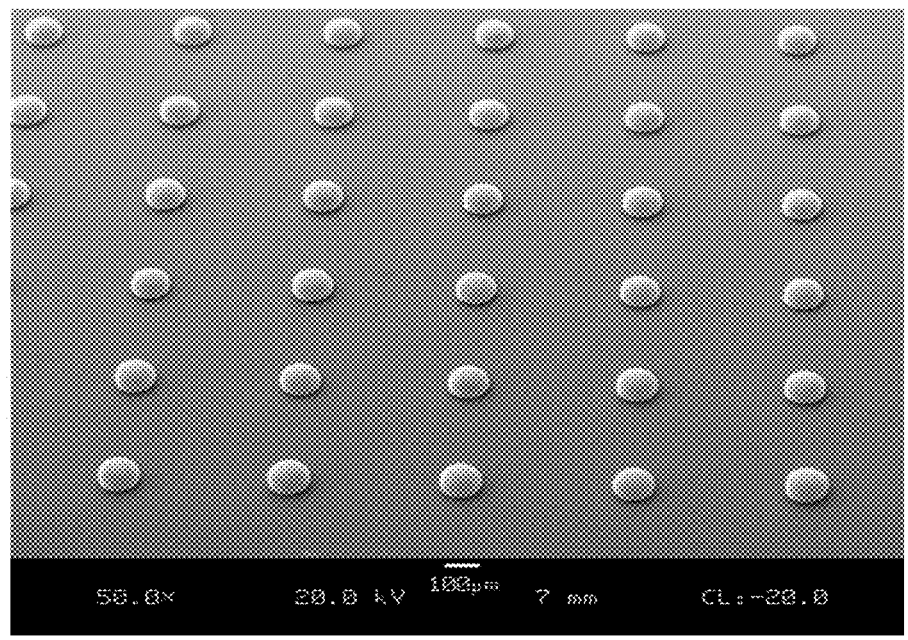
FIGS. 4A-4D are scanning electron micrographs showing the releasability of the adhesive of the invention from surfaces containing solder bumps.
Figure 4B:
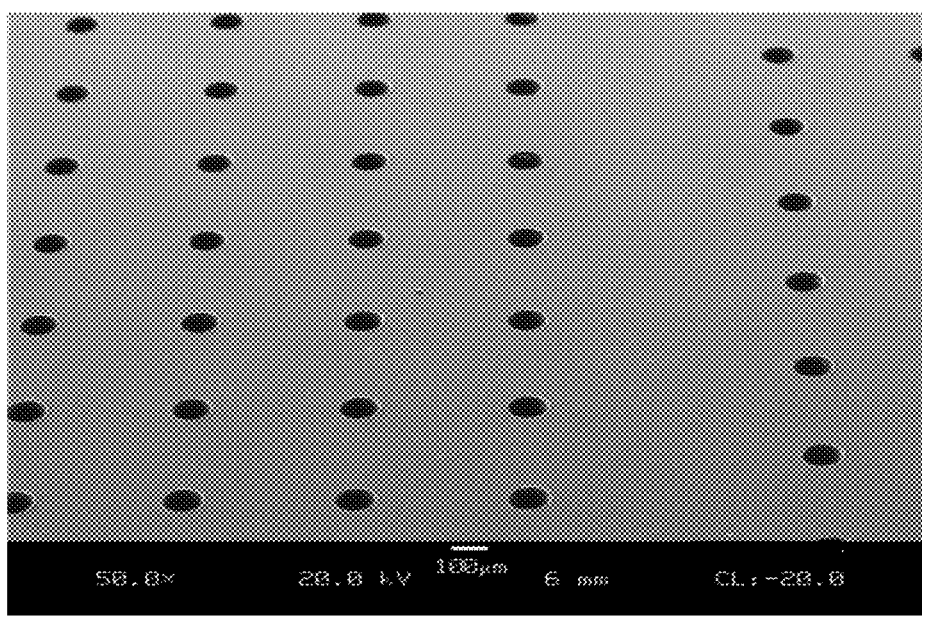
Figure 4C:
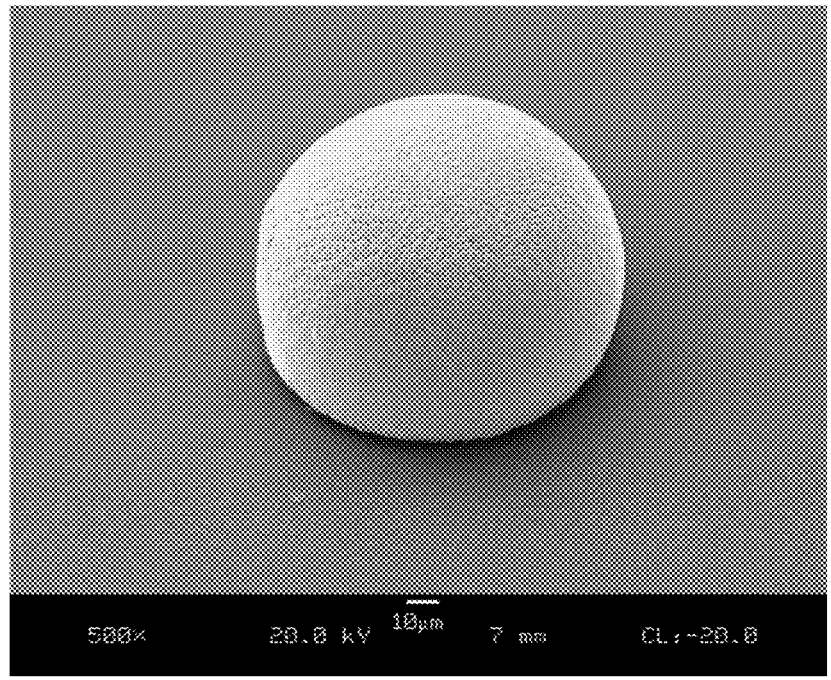
Figure 4D:
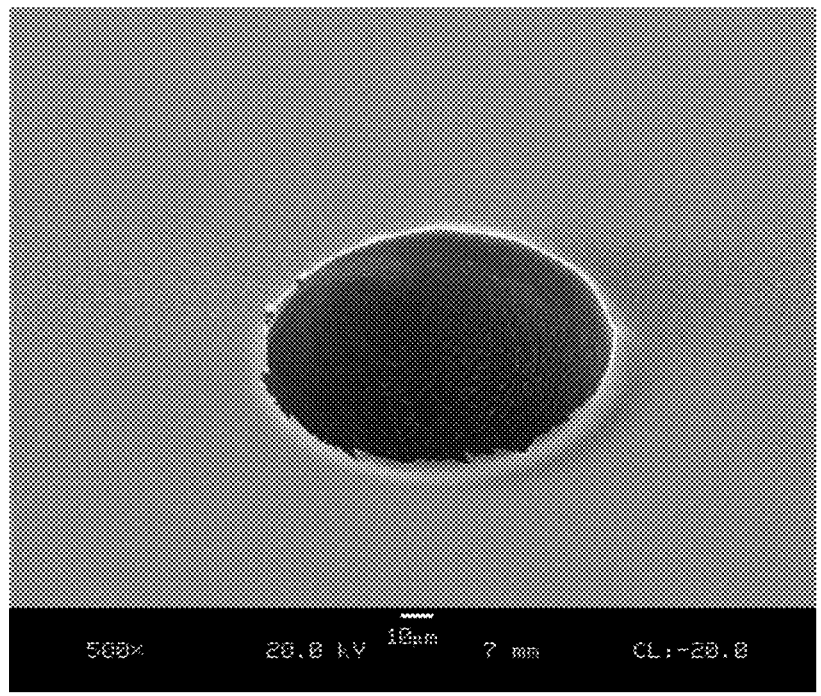

FIGS. 4A-4D are scanning electron micrographs showing the releasability of a semiconductor wafer having an array of solder bumps from the present temporary bonding layer comprising DVS-bisBCB as the curable adhesive material and a polyether release additive. FIG. 4A shows the array of solder bumps on the semiconductor wafer after separation from the present temporary bonding layer and solvent rinsing. FIG. 4B is shows the surface of the temporary bonding layer after separation from the semiconductor wafer. FIG. 4C is a close-up view of a single solder bump from the array on the semiconductor wafer and FIG. 4D is a close-up of a single hole in the temporary bonding layer after separation of the semiconductor wafer. As can be seen from these micrographs, the semiconductor wafer separated completely from the temporary bonding layer, with no visible residue remaining on either the wafer surface or on the solder bumps after solvent rinsing.

Certain topographic features, such as solder bumps, present challenges in removing any temporary bonding layer due to their shape. Accordingly, higher amounts of release additive may be required in the present temporary bonding compositions in order to ensure good release of a semiconductor wafer having these topographic features. Higher amounts of release additive will result in a larger region (3b in FIG. 2B) that predominantly comprises the release additive adjacent to the front side of the semiconductor wafer, which will facilitate separation of the wafer in areas having such topographic features.

The following test methods were used in the following examples.

Semiconductor Wafer Coating:

Silicon wafers were coated on a Brewer CEE 400 spin-coating system with an integrated hot plate and wafer transfer system. An amount (6-8 g) of a sample was disposed on an untreated silicon wafer using a dynamic dispense and a spin speed of 1000 to 2000 rpm for up to 45 seconds, followed by soft bake at 120° C. for 90 seconds on a hot plate. The final coating thickness was inversely dependent on spin speed and ranged from 25 to 50 μm.

Carrier Substrate Coating:

Unless other wise specified, carrier wafers were prepared for the bonding study by treating the wafer surface with a trialkoxysilane adhesion promoter (AP3000™ Adhesion Promoter available from Dow Electronic Materials) to enhance adhesion of the temporary bonding layer after cure. The adhesion promoter was applied using a spin-coater with a static dispense followed by spinning at 2000 rpm for 45 seconds and a hot plate bake step at 90° C. for 90 sec.

Semiconductor Wafer to Carrier Substrate Bonding:

Two silicon wafer pieces, one having a layer of temporary bonding composition disposed thereon, were bonded by heating on a hot plate placing in direct contact and then attaching a clamp to prevent the parts from sliding apart. The samples were then cured in a rapid thermal annealing chamber at 260° C. for 1 hour.

Single Cantilever Beam Adhesion Test:

Parts to be evaluated were attached to a load cell and then the semiconductor wafer and carrier substrate were separated at a slow rate by applying a wedge open stress, according to the method described in S. Chauffaille, et al., "Pre-Cracking Behaviour in the Single Cantilever Beam Adhesion Test," Int. J. Fract (2011) 169: 133-144.

EXAMPLE 1

Control 1

A composition containing 63 wt % of DVS-bisBCB oligomer (as curable adhesive material) solution in mesitylene (from The Dow Chemical Company) was deposited onto a clean silicon wafer by spin-coating followed by a 120° C./10 min soft bake to remove the solvent. On a second silicon wafer (the carrier substrate), the adhesion promoter was applied by spin-coating followed by a 120° C./2 min soft bake to remove the solvent. The two wafers were pressed together at 180° C. for 10 minutes followed by a cure at 210° C. for 30 minutes. The bonded wafer pair was allowed to cool to room temperature. Upon attempting to separate the semiconductor wafer from the carrier substrate using a wedge-open process, where a wedge such as a razor blade is inserted between the wafers and used to pry them apart, it was found that the wafers could not be separate due to the high adhesion energy of the cured adhesive material.

EXAMPLE 2

Control 2

A composition of DVS-bisBCB oligomer (25,000 molecular weight) in mesitylene at 65% solids was spin-coated on a semiconductor wafer and cured. The adhesion of the cured DVS-bisbenzocyclobutene film to the silicon surface was measured to be 9 J/m$^2$ using the single cantilever beam test method.

EXAMPLE 3

Comparative

To 100 g of 63% DVS-bisBCB oligomer (having a molecular weight of 25,000) in mestiylene was added 13.83 g of BAC-45, a diacrylate terminated butadiene rubber having a molecular weight of 3000 to generate a transparent solution.

The solution was filtered through a 0.4 μm polytetrofluoroethylene (PTFE) filter. The solution was spin-coated on a semiconductor wafer and cured. The adhesion of the cured DVS-bisbenzocyclobutene film to the silicon surface was measured to be 64.5 J/m² using the single cantilever beam test method. In addition, no phase separation in the cured DVS-bisBCB layer was observed.

EXAMPLE 4

To 100 g of a 63% solid DVS-bisBCB (curable adhesive material) solution in mestiylene was added 11.18 g (15 wt % based on the total weight of the composition) of poly(tetramethylene glycol), having a molecular weight of 2000, (available as PolyTHF 2000, from BASF) as the release additive. Upon mixing, a single phase system formed with no visible phase separation. The solution was filtered through a 0.4 μm PTFE membrane. The solution was spin-coated on a semiconductor wafer and cured. The adhesion of the cured DVS-bisbenzocyclobutene film to the silicon surface was measured to be 1-2 J/m² using the single cantilever beam test method. The release additive was shown to migrate to the surface based on the waxy appearance and the easy removal of the cured adhesive material from the silicon wafer.

EXAMPLE 5

The procedure of Example 4 was repeated except that an ethylene oxide-butylene oxide-ethylene oxide block copolymer was used at 10 wt %. The adhesion of the cured DVS-bisbenzocyclobutene film to the silicon surface was measured to be <1 J/m² using the single cantilever beam test method. The release additive was shown to migrate to the surface based on the waxy appearance and the easy removal of the cured adhesive material from the silicon wafer.

EXAMPLE 6

A composition containing 90 g of a 63 wt % DVS-bisBCB oligomer (curable adhesive material) in mesitylene and 10 g of polyethylene glycol having a 12,000 molecular weight (from Fluka) as the release additive was prepared and stirred at 120° C. until a homogenous mixture was obtained. The resulting temporary bonding composition was then cooled to room temperature. Next, the temporary bonding composition was deposited onto a clean silicon wafer (semiconductor wafer) by spin-coating followed by a 120° C./10 min soft bake to remove the solvent. On a second silicon wafer (carrier substrate), the adhesion promoter was applied by spin-coating followed by a 120° C./2 min soft bake. The two wafers were then pressed together at 180° C. for 10 minutes followed by a cure at 210° C. for 30 minutes. The bonded wafer pair is allowed to cool to room temperature. Upon the insertion of a sharp razor edge between the wafers, the two wafers were easily separated with the cured temporary bonding layer adhering to the carrier substrate wafer.

EXAMPLE 7

The procedure of Example 6 was repeated except that the following release additives were used. In each case, the amount of the release additive was 10 g (10 wt %). In each case, the two wafers were easily separated with the cured temporary bonding layer adhering to the carrier substrate wafer. In the following table, "EO" refers to ethyleneoxy, "PO" refers to propyleneoxy, and "BO" refers to butyleneoxy. Visual inspection was used to note the presence of any residue remaining on the surface of the semiconductor wafer after separation from the temporary bonding layer. Such remaining residue is easily removed by rinsing the semiconductor wafer with an appropriate solvent.

| Sample | Release Additive | Mol. Wt. | Residue |
|---|---|---|---|
| 7A | Poly(propylene glycol) | 1000 | No |
| 7B | Poly(tetramethylene glycol) | 2000 | No |
| 7C | EO-PO-EO block copolymer | 4400 | Yes |
| 7D | EO-BO-EO block copolymer | 7000 | No |
| 7E | PO-EO-PO block copolymer | 3100 | Yes |

EXAMPLE 8

Adhesion to Carrier Substrate and Semiconductor Wafer

The function of the release additive is to reduce the adhesion between the cured adhesive material and the semiconductor while sufficient adhesion to the carrier substrate is maintained. This is shown quantitatively by measuring the critical strain energy release rate, $G_C$, of the respective interfaces. The method employed was the single cantilever beam method described above. The critical strain energy release rate, $G_C$, is related to load and fracture ($P_C$), the crack length (a), the beam thickness (h), the beam width (B), and the beam plain strain elastic modulus (E'):

$$G_C = \frac{6a^2 P_C^2}{E' h^3 B^2}$$

The adhesion to an adhesion promoter coated carrier substrate and bare silicon of both pure DVS-BCB and a composition containing 90 wt % DVS-BCB oligomer as the curable adhesive material and 10 wt % poly(tetramethylene glycol) having a molecular weight of 2000 (from BASF) as the release additive was measured. The measured values are reported in the following table, where "APCS" refers to the adhesion promoted carrier substrate surface, "SW" refers to the front side of the semiconductor wafer, and "RA" refers to the release additive.

| Interface | Adhesion Energy (J/m²) |
|---|---|
| APCS/100% DVS-BCB (Control) | 56 |
| APCS/90% DVS-BCB + 10% RA (Invention) | 41 |
| SW/100% DVS-BCB (Control) | 10 |
| SW90% DVS-BCB + 10% RA (Invention) | 2 |

The poly(tetramethylene glycol) release additive reduces the adhesion of the cured composition to silicon by 80%, enabling release of the semiconductor wafer. Additionally, the adhesion to the adhesion promoted coated carrier substrate is only reduced by 27%, thus ensuring that the cured composition will adhere to carrier substrate while releasing cleanly from the semiconductor wafer.

EXAMPLE 9

The procedure of Example 4 is repeated except that a tetrafunctional block copolymer derived from the sequential addition of propylene oxide ("PO") and ethylene oxide ("EO") to ethylene diamine, having an average molecular weight of 4700 and a PO:EO ratio of 90:10 (TETRONIC 901, available from BASF), is used as the release additive.

EXAMPLE 10

The procedure of Example 9 is repeated except that a tetrafunctional block copolymer derived from the sequential addition of PO and EO to ethylene diamine, having an average molecular weight of 4000 and a PO:EO ratio of 80:20 (TETRONIC 702, available from BASF), is used as the release additive in an amount of 20 wt %, based on the total weight of the composition.

EXAMPLE 11

The procedure of Example 9 is repeated except that a tetrafunctional block copolymer derived from the sequential addition of PO and EO to ethylene diamine, having an average molecular weight of 4000 and a PO:EO ratio of 60:40 (TETRONIC304, available from BASF), is used as the release additive in an amount of 23 wt %, based on the total weight of the composition.

EXAMPLE 12

A temporary bonding composition is prepared by combining 6 g of an ethene-norbornene copolymer (TOPAS™ 5010, $T_g$ 110° C.; available from TOPAS Advanced Polymers, Florence, Ky.), 35 g of methylcyclohexane, 14 g of a low molecular weight cycloolefin copolymer (TOPAS™ Toner™, $M_w$ 8000, $M_w/M_n$ 2.0), and 5 g of poly(tetramethylene glycol) having a molecular weight of 2000 (available as POLYTHF 2000, from BASF) as the release additive. The solution is allowed to stir at room temperature until the ingredients dissolve. The composition is then used to bond a wafer to a carrier substrate according to the procedure of Example 1.

EXAMPLE 13

A temporary bonding composition is prepared by combining 7.5 g of an ethene-norbornene copolymer (TOPAS™ 5013, $T_g$ 134° C., 40 g of methylcyclohexane, 12.5 g of a low molecular weight cycloolefin copolymer (TOPAS™ Toner™, $M_w$ 8000, $M_w/M_n$ 2.0), 0.15 grams of a phenolic antioxidant (IRGANOX™ 1010), and 0.2 grams of a phosphonite antioxidant (IRGAFOX™ P-EPQ) and 7.5 g of polyethylene glycol having a 12,000 molecular weight as the release additive. The solution is allowed to stir at room temperature until the ingredients dissolve. The composition is then used to bond a wafer to a carrier substrate according to the procedure of Example 1.

EXAMPLE 14

A temporary bonding composition is prepared by combining 26.4 g of a hydrogenated norbornene-based copolymer prepared by ring-opening polymerization (ZEONOR™ 1060, $T_g$ 100° C.; available from Zeon Chemicals, Louisville, Ky.), 21.6 g of a low molecular weight cycloolefin copolymer (TOPAS™ Toner™), 72 g of methylcyclohexane, and 35 g of a tetrafunctional block copolymer derived from the sequential addition of PO and EO to ethylene diamine, having an average molecular weight of 4000 and a PO:EO ratio of 80:20 (TETRONIC 702), is used as the release additive. The solution is allowed to stir at room temperature until the ingredients dissolve. The composition is then used to bond a wafer to a carrier substrate according to the procedure of Example 1.

EXAMPLE 15

In a 250 mL 3-neck round bottom reaction flask suspended in an IKA oil stir/bath, equipped with a condenser, 60 mL addition funnel, magnetic stir bar, nitrogen purge, JKem thermocouple probe, benzoyl peroxide (LUPEROX™ A98) (9.68 g, 0.04 mol) was dissolved in PROGLYDE™ DMM solvent (150 g, 0.32 mol) and heated to 90° C. Styrene (33.08 g, 0.32 mol) and diallyl maleate (6.92 g, 0.04 mol) were mixed together, transferred to the addition funnel, and the monomer mixture was added dropwise to the reaction flask over 30 minutes while maintaining the reaction temperature at 90° C. After 2.5 hours, the reaction mixture was allowed to cool to room temperature, and methanol (approximately 10× volume excess) was then added dropwise. The precipitated polymer was allowed to sit overnight before filtration. The polymer was isolated by vacuum filtration, washed 2×250 mL of MeOH, air dried in a crystallizing dish, and then dried under vacuum at 20-30° C. for 12 hours. The resulting styrene-diallyl maleate oligomer had an approximate styrene:diallyl maleate molar ratio of 90:10.

EXAMPLE 16

The general procedure of Example 15 was repeated except that the diallyl maleate was replaced with an equivalent molar amount of allyl methacrylate, to provide a styrene-allyl methacrylate oligomer having an approximate styrene: allyl methacrylate molar ratio of 90:10.

EXAMPLE 17

The general procedure of Example 15 was repeated except that the diallyl maleate was replaced with an equivalent molar amount of allyl cinnamate, to provide a styrene-allyl cinnamate oligomer having an approximate styrene:allyl cinnamate molar ratio of 90:10.

EXAMPLE 18

A coating composition was prepared by combining 83.63 g of 68.5% DVS-bisBCB oligomer (having a molecular weight (Mw) of 25,000-30,000) in PROGLYDE™ DMM was added 8.78 g of poly(tetramethylene glycol) having a molecular weight of 2900, (available as POLYTHF 2900, from BASF) as the release additive, 4.17 g of BAC-45 (a diacrylate terminated butadiene rubber having a molecular weight of 3000), 0.68 g of dicumyl peroxide, 0.49 g of a commercial antioxidant, and 2.25 g of PROGLYDE™ DMM solvent. The composition was manually mixed with a wooden stick, heated to 50° C. for approximately 1 hour, and then rolled until homogeneous.

200 mm silicon wafers were subjected to an oxygen plasma etch for 10 seconds. Next, a commercial adhesion promoter was spin coated on the attachment surface of a carrier wafer (2000 rpm), followed by a soft bake at 120° C. for 90 seconds, and then followed by cooling. Next, the coating composition was spin coated (2000 rpm) on a device wafer, soft baked at 120° C. for 90 seconds, cooled for 30 seconds, and soft baked at 160° C. for 120 seconds to form a layer of a temporary bonding composition on the device wafer. The carrier wafer was then vacuum laminated to the temporary bonding composition at 80° C. for 60 seconds, with vacuum applied for 45 seconds and pressure applied for 60 seconds. The laminated wafers were then cured by heating on a hot plate, device side down, for 120 seconds at 210° C., in a nitrogen atmosphere. The thickness of the cured temporary bonding layer was approximately 25 μm. Following curing, the wafers were successfully debonded with a razor blade inserted near a notch and guided around the wafer. What residue remained on the device wafer was easily removed by rinsing with acetone.

EXAMPLE 19

The procedure of Example 18 was repeated except that the coating composition also contained 41.82 g of the styrene:diallyl maleate oligomer from Example 15. The coating composition contained DVS-bisBCB oligomer and styrene:diallyl maleate oligomer in a weight ratio of 1:1. The thickness of the cured temporary bonding layer from this composition was approximately 26 μm. Following curing, the wafers were successfully debonded with a razor blade inserted near a notch and guided around the wafer. No residue was visible on the device wafer after debonding.

EXAMPLE 20

The procedure of Example 18 was repeated except that the DVS-bisBCB oligomer was replaced with 83.63 g of the styrene:diallyl maleate oligomer (from Example 15) in PROGLYDE™ DMM solvent (68.5% solids). This coating composition contained no DVS-bisBCB oligomer. The thickness of the cured temporary bonding layer from this composition was approximately 36 μm. Following curing, the wafers were successfully debonded with a razor blade inserted near a notch and guided around the wafer. What residue remained on the device wafer was removed by pressure rinsing with acetone or soaking in acetone.

EXAMPLE 21

The general procedure of Example 20 was repeated except that the styrene:diallyl maleate oligomer used had a mol ratio of 99:1. The wafers used were 100 mm. The device wafer debonded cleanly.

EXAMPLE 22

The general procedure of Example 20 was repeated except the styrene: diallyl maleate oligomer was replaced with a 95:5 styrene:dipentene oligomer. The wafers used were 100 mm. The device wafer debonded cleanly.

What is claimed is:

1. A method of releasably attaching a semiconductor wafer to a carrier substrate comprising:
   (a) providing a semiconductor wafer having a front side and a back side;
   (b) providing a carrier substrate having an attachment surface;
   (c) disposing a temporary bonding composition comprising a curable adhesive material and a release additive between the front side of the semiconductor wafer and the attachment surface of the carrier substrate;
   (d) curing the adhesive material to provide a temporary bonding layer disposed between the front side of the semiconductor wafer and the attachment surface of the carrier substrate; wherein the temporary bonding layer adjacent to the attachment surface of the carrier substrate comprises a relatively lower amount of the release additive and the temporary bonding layer adjacent to the front side of the semiconductor wafer comprises a relatively higher amount of the release additive; wherein the release additive is a polyether compound; and wherein the release additive is free of silicon;
   (e) performing an operation on the back side of the semiconductor wafer; and
   (f) separating the front side of the semiconductor wafer from the temporary bonding layer.

2. The method of claim 1 wherein the curable adhesive material is chosen from polyarylene oligomers, cyclic-olefin oligomers, arylcyclobutene oligomers, and mixtures thereof.

3. The method of claim 1 wherein the release additive is chosen from polyalkylene oxide homopolymers and polyalkylene oxide copolymers.

4. The method of claim 1 wherein the polyether compound comprises terminal groups chosen from hydroxy, alkoxy, aryloxy, and mixtures thereof.

5. The method of claim 1 wherein the polyether compound is chosen from polyethylene glycol, polypropyleneglycol, poly(1,3-propanediol), polybutyleneglycol, poly(tetrahydrofuran), ethylene glycol-propylene glycol copolymers, and mixtures thereof.

6. The method of claim 1 wherein the temporary bonding composition is cured by the use of heat, light, radiation, or a mixture thereof.

7. The method of claim 1 further comprising the step of treating the attachment surface of the carrier substrate with an adhesion promoter prior to contact with the temporary bonding composition.

8. The method of claim 1 wherein the temporary bonding composition further comprises an organic solvent.

9. The method of claim 1 wherein the release additive is non-curable under conditions used to cure the adhesive material.

10. The method of claim 1 wherein the release additive phase separates from the adhesive material during curing of the adhesive material.

* * * * *